(12) United States Patent
Fastow et al.

(10) Patent No.: US 7,414,281 B1
(45) Date of Patent: Aug. 19, 2008

(54) FLASH MEMORY WITH HIGH-K DIELECTRIC MATERIAL BETWEEN SUBSTRATE AND GATE

(75) Inventors: Richard M. Fastow, Cupertino, CA (US); Yue-Song He, San Jose, CA (US); Zhigang Wang, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 189 days.

(21) Appl. No.: 10/658,936

(22) Filed: Sep. 9, 2003

(51) Int. Cl.
*H01L 29/76* (2006.01)

(52) U.S. Cl. ............... 257/314; 257/315; 257/316; 257/321; 257/E21.681; 257/E21.682; 438/257; 438/263

(58) Field of Classification Search .......... 257/314, 257/315, 321, 316, 324; 438/199, 257
See application file for complete search history.

(56) References Cited

U.S. PATENT DOCUMENTS

| | | | |
|---|---|---|---|
| 6,143,606 A * | 11/2000 | Wang et al. | 438/257 |
| 6,348,380 B1 * | 2/2002 | Weimer et al. | 438/257 |
| 6,617,639 B1 * | 9/2003 | Wang et al. | 257/324 |
| 6,693,321 B1 * | 2/2004 | Zheng et al. | 257/314 |
| 6,713,810 B1 * | 3/2004 | Bhattacharyya | 257/315 |
| 6,750,502 B1 * | 6/2004 | Sandhu et al. | 257/315 |
| 6,784,480 B2 * | 8/2004 | Bhattacharyya | 257/314 |
| 6,803,275 B1 * | 10/2004 | Park et al. | 438/257 |
| 6,872,972 B2 * | 3/2005 | Huang et al. | 257/52 |

OTHER PUBLICATIONS http://www.semiconductorglossary.com/default.asp?SearchedField=Yes&SearchTerm=silicon+dioxide.*

* cited by examiner

*Primary Examiner*—Dao H Nguyen

(57) ABSTRACT

A flash memory cell and a method of forming the same are described. The flash memory cell may include a substrate having a source and a drain, a gate element, and a dielectric layer between the substrate and the gate element. The dielectric layer includes a dielectric material having a dielectric constant that is greater than that of silicon dioxide.

4 Claims, 2 Drawing Sheets

FLASH MEMORY WITH HIGH-K DIELECTRIC MATERIAL BETWEEN SUBSTRATE AND GATE

TECHNICAL FIELD

The present claimed invention generally relates to semiconductor devices such as transistors. More specifically, the present claimed invention relates to transistors used as flash memory cells.

BACKGROUND ART

Various techniques known in the art can be used to fabricate a semiconductor device such as a transistor. In general, these techniques involve repeating, with variations, a number of characteristic steps or processes. One of these characteristic steps or processes involves applying a layer of material to an underlying substrate or to a preceding layer, and then selectively removing the material using, for example, an etch process. Another of the characteristic steps or processes involves selectively adding a dopant material to the substrate or to one or more of the subsequent layers, in order to achieve desirable electrical performance. Using these characteristic processes, a transistor, generally comprising different types of material, can be accurately formed.

Transistors may be used as memory cells in a flash memory array as well as in other applications or devices. A typical flash memory cell includes a substrate in which source and drain regions have been formed, and a gate element formed on the substrate in proximity to the source and drain regions. The gate element typically includes a floating gate and a control gate separated by an oxide-nitride-oxide (ONO) layer.

According to the conventional art, the gate element and the substrate (specifically, the source and drain regions in the substrate) are separated by a tunnel oxide layer that consists of silicon dioxide. Typically, the tunnel oxide layer is approximately 80-100 Angstroms (Å) thick. One function of the tunnel oxide is to provide a barrier for the stored electrons in the floating gate, thereby guaranteeing the reliability of the memory cell.

While conventional memory cells perform satisfactorily, it remains desirable to improve the reliability of memory cells. For instance, it is desirable to scale down the size of memory cells, so that a greater number of smaller memory cells can be put into a given area. Improvements in reliability, particularly with regard to the capacity for charge retention, become increasingly important as memory cells are scaled down in size.

Accordingly, a device and/or method providing improved memory cell performance—in particular, an improved capacity for charge retention—would be advantageous. In other words, it is desirable to scale down the sizes of memory cells while continuing to provide substantially the same reliability of larger memory cells. The present invention provides these advantages.

DISCLOSURE OF THE INVENTION

Embodiments of the present invention pertain to flash memory cells and methods of forming the same. In one embodiment, the flash memory cell includes a substrate having a source and a drain, a floating gate element, and a dielectric layer between the substrate and the floating gate element. The dielectric layer includes a dielectric material having a dielectric constant that is greater than that of silicon dioxide (a high-K dielectric material). In one such embodiment, the dielectric layer also includes a first layer comprising a first interfacing material and a second layer comprising a second interfacing material, wherein the high-K dielectric material is layered between these first and second layers. In another embodiment, the dielectric layer includes a single layer of interfacing material in addition to the layer of high-K dielectric material.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

BEST MODES FOR CARRYING OUT THE INVENTION

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," or "etching" or the like, refer to actions and processes (e.g., flowcharts 300 and 400 of FIGS. 3 and 4, respectively) of semiconductor device fabrication.

Figure 1:
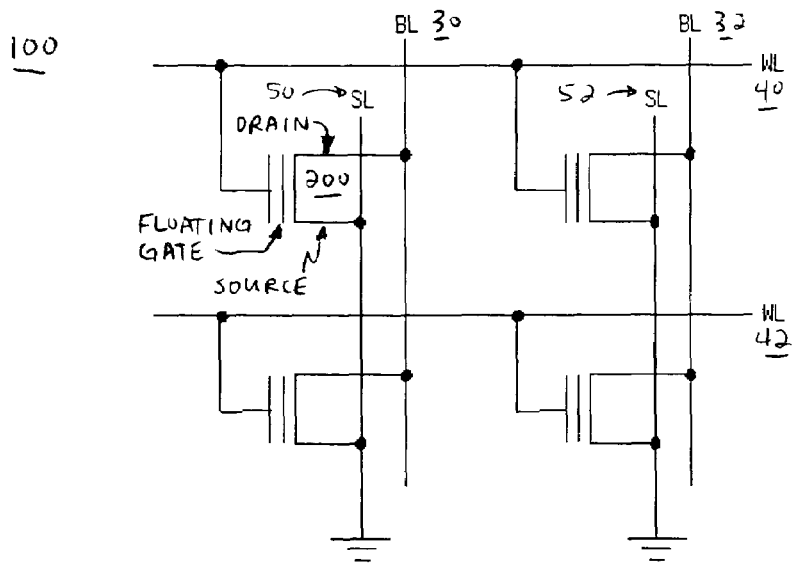
FIG. 1 is a representation of a memory array upon which embodiments of the present invention may be practiced.

FIG. 1 is a representation of a portion of a memory array 100 according to one embodiment of the present invention. In one embodiment, memory array 100 is a flash memory array.

In FIG. 1, for simplicity of discussion and illustration, only bit lines (BL) 30 and 32, word lines (WL) 40 and 42, and source lines (SL) 50 and 52 are illustrated. However, it is understood that a memory array may actually utilize a different number of bit lines, word lines and source lines. That is, memory array 100 will in actuality extend further to the left and right and also horizontally and vertically (left, right, horizontal and vertical being relative directions). Word lines may be referred to as rows, and bit lines may be referred to as columns; however, it is understood that those are relative terms. It is also understood that only certain elements of a memory array are illustrated; that is, a memory array may actually include elements other than those shown.

Memory array 100 includes a number of memory cells exemplified by memory cell 200. Each memory cell includes, in general, a floating gate coupled to a word line, a drain coupled to a bit line, and a source coupled to a source line.

Figure 2A:
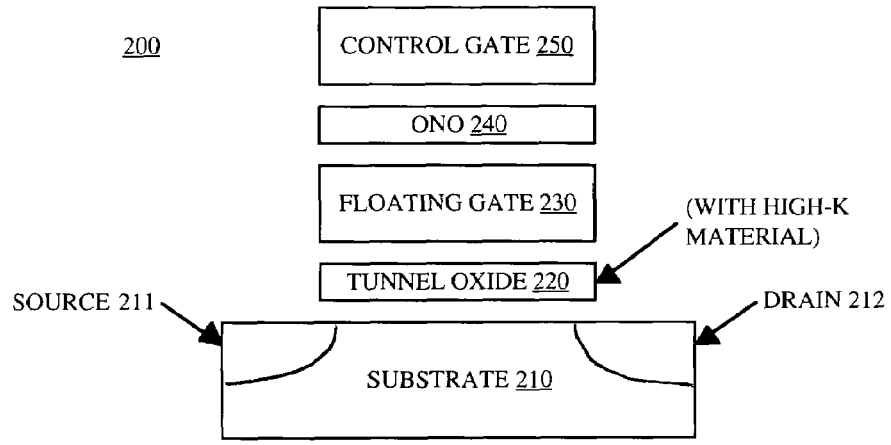
FIG. 2A is a representation of an exemplary memory cell according to one embodiment of the present invention.

FIG. 2A is a representation of an exemplary memory cell 200 according to one embodiment of the present invention. In this embodiment, memory cell 200 is a floating gate memory cell that includes a substrate 210 (usually silicon) in which a source region 211 and a drain region 212 are formed. Typically, memory cell 200 also includes a first oxide layer (e.g., tunnel oxide layer 220), a storage element (e.g., floating gate 230, usually polysilicon), a second oxide layer (e.g., oxide-nitride-oxide [ONO] layer 240), and a control gate 250. In this embodiment, floating gate 230 is used for storing a single bit.

Significantly, in the present embodiment, tunnel oxide layer 220 includes a material (specifically, a dielectric material) that has a dielectric constant (K) higher than that of silicon dioxide ($SiO_2$). In one embodiment, the tunnel oxide layer 220 consists in entirety, or substantially in entirety, of the high-K material (here, high-K refers to a K that is higher than that of silicon dioxide). In another embodiment, the tunnel oxide layer 220 includes a layer of high-K material situated between layers of an interfacing material; this is described further in conjunction with FIG. 2B below. In another embodiment, the tunnel oxide layer 220 includes a single layer of interfacing material and a layer of high-K material; this is described further in conjunction with FIG. 2C below.

The dielectric constant of silicon dioxide is known in the art. Typically, the dielectric constant for silicon dioxide may range from 3.0-5.0. It is understood that the dielectric constant is a function of a number of parameters such as temperature, method of measurement, and sample quality. It is also understood that the dielectric constant provides a measurement of the property of a material that determines the relative speed at which an electrical signal will travel through the material. Other terms may be used to identify this property, and there may be other properties of materials that are substantially related to the dielectric constant. For example, permittivity may be used in place of dielectric constant, and a material's dissipation factor may be related to its dielectric constant.

Figure 2B:
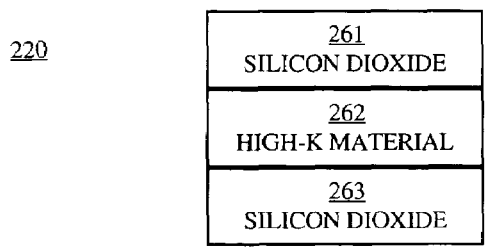
FIG. 2B is a representation of a tunnel oxide layer according to one embodiment of the present invention.

FIG. 2B is a representation of a tunnel oxide layer 220 according to one embodiment of the present invention. In the present embodiment, the tunnel oxide layer 220 includes a layer of some type of interfacing material (e.g., silicon dioxide layer 263), a layer 262 of high-K material, and another layer of some type of interfacing material (e.g., silicon dioxide layer 261). Although the use of silicon dioxide is shown for layers 261 and 263, it is appreciated that the present invention is not so limited. For example, the layers 261 and 263 can instead include silicon oxynitride, silicon oxynitrate, or some other suitable material. Typically, the layer 262 of high-K material is some type of metal oxide.

In the present embodiment, layers 261 and 263 serve as interfacing layers between the layer 262 of high-K material and the floating gate 230 and the substrate 210 of FIG. 2A. In other embodiments, the layers 261 and 263 are not present, such that the tunnel oxide layer 220 consists in entirety, or essentially in entirety, of the layer 262 of high-K material.

Figure 2C:
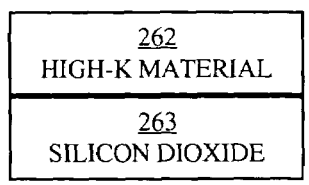
FIG. 2C is a representation of a tunnel oxide layer according to another embodiment of the present invention.

With reference to FIG. 2C, in one embodiment, tunnel oxide layer 220 utilizes only a single interfacing layer 263, perhaps between the layer 262 and the adjacent floating gate, or perhaps between the layer 262 and the adjacent substrate.

With layer 261 and/or layer 263 not present, a lower conduction band offset with a silicon substrate (e.g., substrate 210) can result. This is expected to make the memory cell 200 easier to program. The thickness of the layer 262 of high-K material can also influence ease of programming.

Although the invention is described in certain embodiments, it is appreciated that, in other embodiments, other combinations of interfacing and dielectric layers may be used. For example, tunnel oxide layer 220 can be configured to include multiple alternating layers of interfacing materials and high-K materials.

It is also appreciated that the thicknesses of the layers 261-263 are matters of design choice. The thicknesses of each layer in tunnel oxide layer 220, or the total thickness of tunnel oxide layer 220, can be specified according to characteristics selected for the memory cell 200. For example, for a memory cell utilizing a tunnel oxide layer that includes a high-K material, a tunnel oxide layer thickness of 80-100 Angstroms (Å) can provide a greater capacity for charge retention, and thus higher reliability, than a memory cell utilizing a similar thickness of tunnel oxide that does not include the high-K material.

Alternatively, for a memory cell utilizing a tunnel oxide layer that includes a high-K material, a tunnel oxide layer thickness of less than 80-100 Å can provide approximately the same (or perhaps greater) capacity for charge retention as a memory cell utilizing a greater thickness of tunnel oxide that does not include the high-K material. Thus, by incorporating a high-K material into the tunnel oxide layer, at least the same degree of reliability can be retained even if the thickness of the tunnel oxide layer is reduced. In other words, by incorporating a high-K material into the tunnel oxide layer, memory cells at least as reliable as the conventional art can be produced but with a thinner effective oxide thickness.

Figure 3:
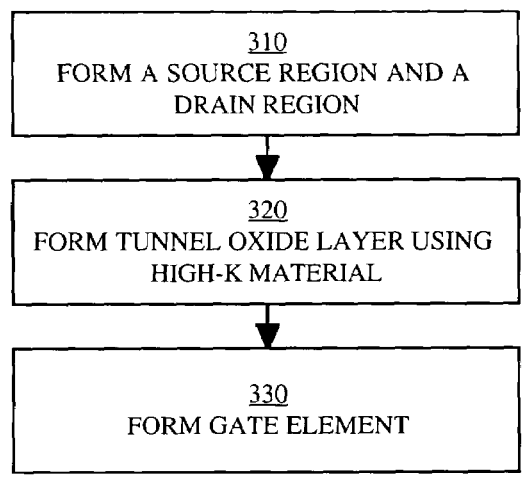
FIG. 3 is a flowchart of a method for forming a memory cell according to one embodiment of the present invention.

FIG. 3 is a flowchart 300 of a process for forming a memory cell according to one embodiment of the present invention. Although specific steps are disclosed in flowchart 300, such steps are exemplary. That is, the present invention is well suited to performing various other steps or variations of the steps recited in flowchart 300. For simplicity of discussion and illustration, flowchart 300 is described for a single memory cell, although in actuality multiple memory cells may be formed.

It is appreciated that other processes and steps associated with the fabrication of a memory cell may be performed along with the process illustrated by FIG. 3; that is, there may be a number of process steps before and after the steps shown and described by FIG. 3. Importantly, embodiments of the present invention can be implemented in conjunction with these other (conventional) processes and steps without significantly perturbing them. Generally speaking, process steps associated with the various embodiments of the present invention can be added to a conventional process without significantly affecting the peripheral processes and steps.

In step 310, in the present embodiment, source and drain regions are formed at a location on a substrate.

In step 320 of FIG. 3, in the present embodiment, a tunnel oxide layer is formed (e.g., tunnel oxide layer 220 of FIG. 2A). According to the various embodiments of the present invention, the tunnel oxide layer includes (entirely or in part) a dielectric material that has a dielectric constant that is greater than that of silicon dioxide.

In step 330 of FIG. 3, in the present embodiment, a gate element is formed. In one embodiment, the gate element includes a floating gate, an ONO layer, and a control gate.

Figure 4:
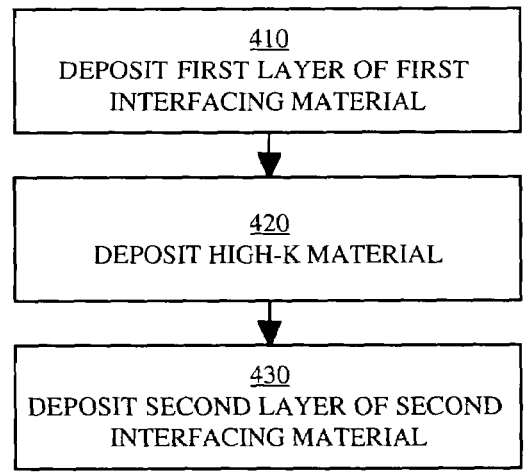
FIG. 4 is a flowchart of a method for forming a tunnel oxide layer according to one embodiment of the present invention.

FIG. 4 is a flowchart 400 of a method for forming a tunnel oxide layer according to one embodiment of the present invention. Although specific steps are disclosed in flowchart 400, such steps are exemplary. That is, the present invention is well suited to performing various other steps or variations of the steps recited in flowchart 400. For simplicity of discussion and illustration, flowchart 400 is described for a single memory cell, although in actuality multiple memory cells may be formed.

In step 410, in the present embodiment, a first layer of a first interfacing material is produced (deposited or grown) on a substrate. Referring to FIG. 2B, in one embodiment, the first layer 263 is a layer of silicon dioxide, although it is appreciated that other materials may be used as the first interfacing material.

In step 420 of FIG. 4, in the present embodiment, a layer of dielectric material (e.g., layer 262 of FIG. 2B) is deposited over the first layer. In one embodiment, the layer 262 includes a dielectric material having a dielectric constant that is greater than that of silicon dioxide.

In step 430 of FIG. 4, in the present embodiment, a second layer of a second interfacing material is deposited on the layer of dielectric material, such that the dielectric material is layered between the first and second layers. Referring to FIG. 2B, in one embodiment, the second layer 261 is a layer of silicon dioxide, although it is appreciated that other materials may be used as the second interfacing material. It is appreciated that the first and second interfacing materials may be the same or different materials. It is also appreciated that, in alternate embodiments, either or both of the first and second interfacing layers may not be formed; that is, step 410 and/or step 430 can be skipped.

In summary, embodiments of the present invention pertain to devices and methods that provide improved memory cell performance—in particular, an improved capacity for charge retention. Accordingly, memory cells scaled down in size can provide substantially the same reliability as larger memory cells.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A flash memory cell comprising:
   a substrate comprising a source and a drain;
   a silicon dioxide layer adjoining said substrate;
   a dielectric layer adjoining said silicon dioxide layer, said dielectric layer comprising a dielectric material having a dielectric constant greater than that of silicon dioxide, wherein said dielectric material comprises a metal oxide;
   a polysilicon floating gate adjoining said dielectric layer;
   an oxide-nitride-oxide (ONO) layer adjoining said floating gate; and
   a control gate adjoining said ONO layer, wherein said substrate, said silicon dioxide layer, said dielectric layer, said floating gate, said ONO layer and said control gate are arranged in a laminate structure, wherein said silicon dioxide layer is sandwiched between said substrate and said dielectric layer, wherein said dielectric layer is sandwiched between said silicon dioxide layer and said floating gate, and wherein said ONO layer is sandwiched between said floating gate and said control gate.

2. The flash memory cell of claim 1 wherein said dielectric layer comprises a composite of said metal oxide and a material selected from the group consisting of silicon dioxide, silicon oxynitride and silicon oxynitrate.

3. A flash memory array comprising memory cells, wherein a memory cell comprises:
   a substrate comprising a source and a drain;
   a tunnel oxide layer adjoining said substrate, said tunnel oxide layer comprising a dielectric material having a dielectric constant greater than that of silicon dioxide, wherein said dielectric material comprises a metal oxide;
   a first layer comprising a silicon material;
   a polysilicon floating gate adjoining said first layer;
   an oxide-nitride-oxide (ONO) layer adjoining said floating gate; and
   a control gate adjoining said ONO layer, wherein said substrate, said tunnel oxide layer, said first layer, said floating gate, said ONO layer and said control gate are arranged in a laminate structure, wherein said tunnel oxide layer is sandwiched between said substrate and said first layer, wherein said first layer is sandwiched between said tunnel oxide layer and said floating gate, and wherein said ONO layer is sandwiched between said floating gate and said control gate.

4. The flash memory array of claim 3 wherein said silicon material is selected from the group consisting of silicon dioxide, silicon oxynitride and silicon oxynitrate.

* * * * *